(12) United States Patent
Roufoogaran et al.

(10) Patent No.: US 8,102,953 B2
(45) Date of Patent: Jan. 24, 2012

(54) METHOD AND SYSTEM FOR CALIBRATING A PLURALITY OF MODULES IN A COMMUNICATION SYSTEM

(75) Inventors: Razieh Roufoogaran, Venice, CA (US); Arya Behzad, Poway, CA (US); Qiang Li, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 944 days.

(21) Appl. No.: 11/618,721

(22) Filed: Dec. 29, 2006

(65) Prior Publication Data

US 2008/0139143 A1 Jun. 12, 2008

Related U.S. Application Data

(60) Provisional application No. 60/868,818, filed on Dec. 6, 2006.

(51) Int. Cl.
*H04L 27/08* (2006.01)
*H04B 1/18* (2006.01)
(52) U.S. Cl. .................. 375/345; 455/209; 455/285
(58) Field of Classification Search .................. 375/319, 375/324, 326, 340, 344, 345, 349; 455/135, 455/136, 138, 139, 141, 146, 147, 179.1, 455/180.1, 180.3, 182.2, 192.2, 193.2, 209, 234.1, 245.2, 251.1, 262, 264, 266, 285
See application file for complete search history.

(56) References Cited

U.S. PATENT DOCUMENTS

| 5,201,070 | A  | * | 4/1993  | Iwahashi ................... 455/91 |
| 5,987,562 | A  | * | 11/1999 | Glover ....................... 711/4 |
| 6,766,178 | B1 | * | 7/2004  | Damgaard et al. ........ 455/552.1 |
| 6,819,706 | B1 | * | 11/2004 | Lim ........................ 375/130 |
| 6,960,962 | B2 | * | 11/2005 | Peterzell et al. ............ 331/40 |
| 2002/0131533 | A1 | * | 9/2002 | Koizumi .................. 375/345 |

\* cited by examiner

*Primary Examiner* — Young T. Tse
(74) *Attorney, Agent, or Firm* — Thomas, Kayden, Horstemeyer & Risley, LLP (57) ABSTRACT

A method and system for calibrating a plurality of modules in a communication system is provided. The method may include selecting a plurality of modules with at least one output signal and calibrating an amplitude of each selected module to be within a specified range if the amplitude is out of the specified range via a gain control processing circuit of the selected module, wherein the plurality of modules may be calibrated in an order starting with a first module located at an input of a signal path and ending with a module located at an output of the signal path. The DC component and amplitude of the envelope of the output signal may be detected by circuitry within the selected module. Muxes may be utilized to route the DC component and amplitude of the envelope to a feedback control processing circuit.

30 Claims, 6 Drawing Sheets

METHOD AND SYSTEM FOR CALIBRATING A PLURALITY OF MODULES IN A COMMUNICATION SYSTEM

CROSS-REFERENCE TO RELATED APPLICATIONS/INCORPORATION BY REFERENCE

This application makes reference to, claims priority to, and claims the benefit of U.S. Provisional Application Ser. No. 60/868,818, filed on Dec. 6, 2006.

This application makes reference to: U.S. application Ser. No. 11/618,716 filed on Dec. 29, 2006; U.S. application Ser. No. 11/618,719 filed on Dec. 29, 2006; U.S. application Ser. No. 11/618,863 filed on Dec. 31, 2006; and U.S. application Ser. No. 11/618,720 filed on Dec. 29, 2006.

Each of the above stated applications is hereby incorporated by reference in its entirety.

FIELD OF THE INVENTION

Certain embodiments of the invention relate to communication systems. More specifically, certain embodiments of the invention relate to a method and system for calibrating a plurality of modules in a communication system.

BACKGROUND OF THE INVENTION

The development and design of radio receivers, transmitter, and/or transceiver systems has been driven by the great demand for devices for mobile wireless communication applications, especially handset devices. With the ever decreasing size of mobile handsets and an ever increasing demand for voice, data, and/or video processing capabilities, there is a growing need to develop radio receivers and transmitters that not only meet these challenging performance requirements, but that do so in smaller integrated circuit (IC) footprints, that is, at lower cost, and with greater power efficiency. One approach that aims at addressing these demands is the development of highly integrated receivers, transmitters, and/or transceivers in complementary metal oxide semiconductor (CMOS) technology to minimize the number of off-chip components.

As a result of these highly integrated systems, radio receivers, transmitters, and/or transceivers may comprise a large number of components and/or circuits, such as VCOs, mixers, and buffers, which may be utilized for the processing of signals. The design of optimal systems may require that these components and/or circuits operate within certain requirements or constraints for a wide range of operational conditions. For example, power amplifiers (PA) and/or low noise amplifiers (LNA) may be required to operate at an optimal gain level. However, this gain level may vary significantly based on operational conditions, such as temperature and/or voltage supplies, or based on manufacturing conditions, such as the non-uniformity in transistor parameters that result from normal variations in the manufacturing process. These variations generally referred to as process, voltage, and temperature (PVT) variations, may have a significant effect in the overall performance of wireless handsets.

In systems based on the global system for mobile communications (GSM) standard, for example, PVT variations in many of the circuits and/or components utilized in the receiver or the transmitter may produce errors in the generation of "I" (in-phase) and "Q" (quadrature) signal components. These errors may result in a significant degradation in the signal-to-noise ratio (SNR) and/or the bit-error-rate (BER) performance of GSM handsets.

In-phase (I) and quadrature (Q) signals are typically utilized in modulation and demodulation sections of transceivers in cellular handsets and other types of communication devices. The I and Q signals, which are 90 degrees out of phase, may be generated, for example, by coupling an input local oscillator signal to first and second outputs via different RC networks. For example, one RC network may include a capacitor coupled between the input and the first output and a resistor coupled between the first output and ground and the other RC network may include a capacitor coupled between the input and the second output and a resistor coupled between the second output and ground. To achieve balanced I and Q signals or I and Q signals having the same amplitude, the resistors in each RC network and the capacitors in each RC network must have the same and predetermined value according to the operation frequency. However, PVT variations may affect the performance of the various VCOs, mixers, and buffers. This in turn may result in an imbalance between the gains in, for example, the I and Q signals. For example, the gain in the I path may be different from the gain in the Q path. This difference may result in degradation in the performance of the system.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A system and/or method is provided for calibrating a plurality of modules in a communication system, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for calibrating a plurality of modules in a communication system. The method may include selecting a plurality of modules with at least one output signal and calibrating an amplitude of each selected module to be within a specified range if the amplitude is out of the specified range via a gain control processing circuit of the selected module. The plurality of modules may be calibrated in an order starting with a first module located at an input of a signal path and ending with a module located at an output of the signal path. The DC component and amplitude of the envelope of the output signal may be detected by circuitry within the selected module. Muxes may be utilized to route the DC component and amplitude of the envelope to a feedback control processing circuit.

Figure 1:
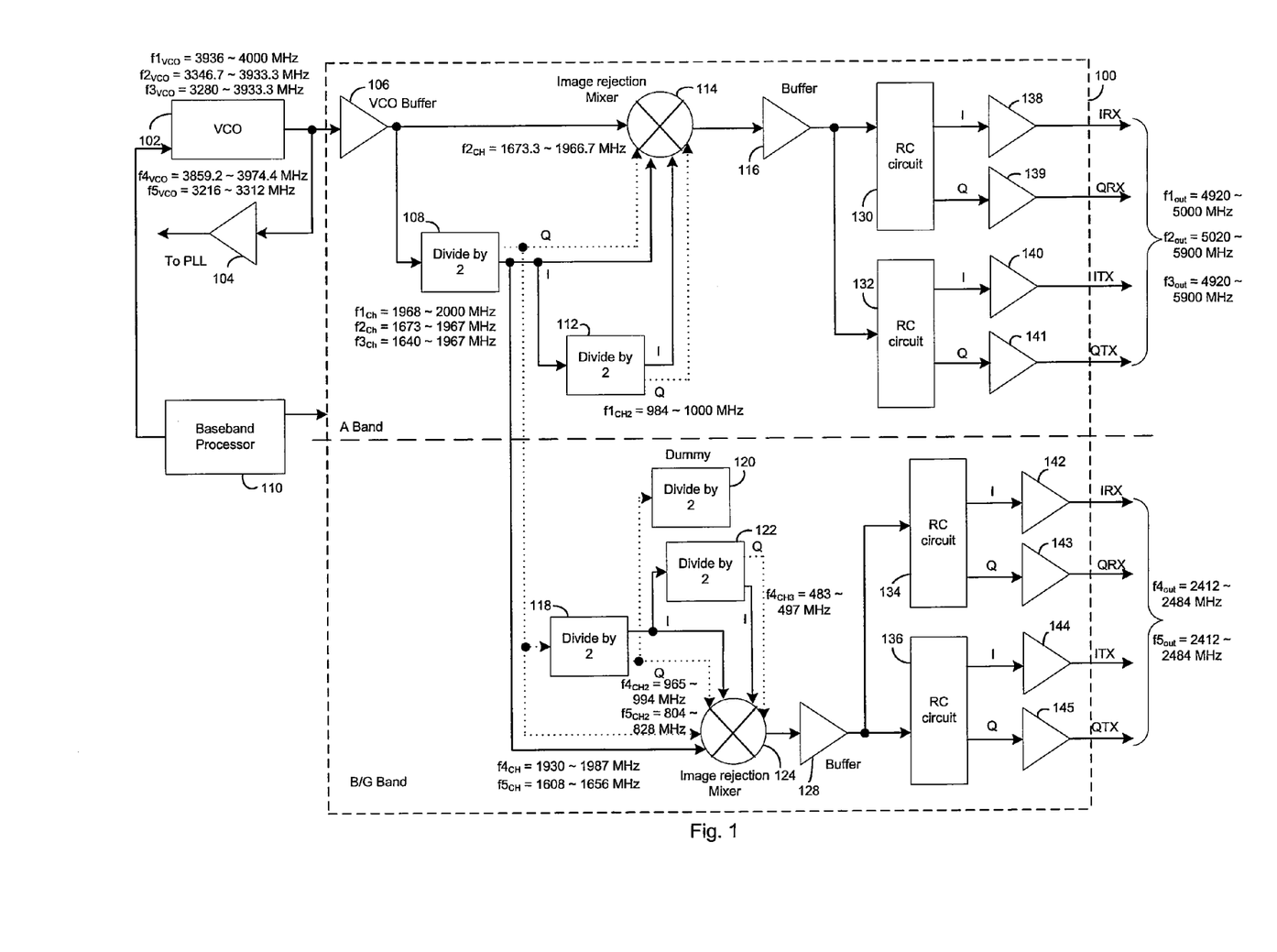
FIG. 1 is a block diagram of an exemplary local oscillator generator architecture for multi-standard wireless communication systems, in accordance with an embodiment of the invention.

FIG. 1 is a block diagram of an exemplary local oscillator generator architecture for multi-standard wireless communication systems, in accordance with an embodiment of the invention. Referring to FIG. 1, there is shown a VCO 102, a buffer 104, a processor 110, and a LO generator 100. The LO generator 100 may comprise a VCO buffer 106, a plurality of image rejection mixers 114 and 124, a plurality of divide by 2 circuits 108, 112, 118, 120, and 122, a plurality of buffers 116 and 128, a plurality of RC circuits 130, 132, 134, and 136, and a plurality of last stage buffers 138, 139, 140, 141, 142, 143, 144, and 145.

The VCO 102 may comprise suitable logic, circuitry, and/or code that may be enabled to generate an output frequency that may be a multiple of the frequency of a reference oscillator. The VCO 102 may be enabled to operate in a plurality of frequency ranges. For example, the VCO 102 may be enabled to operate in a first frequency range, $f1_{VCO}$ of about 3936 MHz to 4000 MHz in divide by 4 mode to generate an output frequency range $f1_{out}$ of about 4920 MHz to 5000 MHz, where $f1_{out}=f1_{VCO}\times 5/4$, for example, a second frequency range, $f2_{VCO}$ of about 3346.7 MHz to 3933.3 MHz in divide by 2 mode to generate an output frequency range $f2_{out}$ of about 5020 MHz to 5900 MHz, where $f2_{out}=f2_{VCO}\times 3/2$, for example, and a third frequency range, $f3_{VCO}$ of about 3280 MHz to 3933.3 MHz in divide by 2 mode to generate an output frequency range $f3_{out}$ of about 4920 MHz to 5900 MHz, where $f3_{out}=f3_{VCO}\times 3/2$, for example, for 802.11a band WLAN operation. The VCO 102 may be enabled to operate in a fourth frequency range, $f4_{VCO}$ of about 3859.2 MHz to 3974.4 MHz in divide by 8 mode to generate an output frequency range $f4_{out}$ of about 2412 MHz to 2484 MHz, where $f4_{out}=f4_{VCO}\times 5/8$, for example, and a fifth frequency range, $f5_{VCO}$ of about 3216 MHz to 3312 MHz in divide by 4 mode to generate an output frequency range $f5_{out}$ of about 2412 MHz to 2484 MHz, where $f5_{out}=f5_{VCO}\times 3/4$, for example, for 802.11 b/g band WLAN operation. The buffer 104 may be enabled to receive a signal from the VCO 102 and generate an output to a PLL in the same frequency range as VCO 102.

The baseband processor 110 may comprise suitable logic, circuitry, and/or code that may be enabled to select LO generator 100 divider configurations depending on a required output frequency range and an input frequency range of operation at VCO 102 based on a particular wireless band of operation, for example, 802.11 a/b/g wireless band of operation. The VCO buffer 106 may comprise suitable logic, circuitry, and/or code that may be enabled to buffer and/or store the received signals from the VCO 102. The plurality of divide by 2 circuits 108, 112, 118, 120, and 122 may comprise suitable logic, circuitry, and/or code that may be enabled to generate the in-phase (I) and quadrature (Q) components of a received signal, and may output the generated I and Q components to a plurality of mixers.

The divide by 2 circuit 108 may be enabled to divide the frequency of the received input signal from the VCO 102 and generate an output signal with half the frequency of the received input signal. For example, the divide by 2 circuit 108 may generate I and Q components of an output signal in the frequency range, $f1_{CH}$ of about 1968 MHz to 2000 MHz, for example, for 802.11 a band WLAN operation in divide by 4 mode and VCO range of $f1_{VCO}$. The divide by 2 circuit 108 may generate I and Q components of an output signal in the frequency range, $f2_{CH}$ of about 1673 MHz to 1967 MHz, for example, for 802.11 a band WLAN operation in divide by 2 mode and VCO range of $f2_{VCO}$. The divide by 2 circuit 108 may generate I and Q components of an output signal in the frequency range, $f3_{CH}$ of about 1640 MHz to 1967 MHz, for example, for 802.11 a band WLAN operation in divide by 2 mode and VCO range of $f3_{VCO}$. The divide by 2 circuit 108 may generate I and Q components of an output signal in the frequency range, $f4_{CH}$ of about 1930 MHz to 1987 MHz, for example, for 802.11 b/g band WLAN operation in divide by 8 mode and VCO range of $f4_{VCO}$. The divide by 2 circuit 108 may generate I and Q components of an output signal in the frequency range, $f5_{CH}$ of about 1608 MHz to 1656 MHz, for example, for 802.11 b/g band WLAN operation in divide by 4 mode and VCO range of $f5_{VCO}$.

The divide by 2 circuit 112 may be enabled to divide the frequency of the received I component of the output signal from the divide by 2 circuit 108 and generate an output signal with half the frequency of the received input signal. For example, the divide by 2 circuit 112 may generate I and Q components of an output signal in the frequency range, $f1_{CH2}$ of about 984 MHz to 1000 MHz, for example, for 802.11 a band WLAN operation in divide by 4 mode and VCO range of $f1_{VCO}$.

The divide by 2 circuit 118 may be enabled to divide the frequency of the received Q component of the output signal from the divide by 2 circuit 108 and generate an output signal with half the frequency of the received input signal for 802.11 b/g band WLAN operation. The divide by 2 circuit 118 may generate I and Q components of an output signal in the frequency range, $f4_{CH2}$ of about 965 MHz to 994 MHz, for example, in divide by 8 mode and VCO range of $f4_{VCO}$. The divide by 2 circuit 118 may generate I and Q components of an output signal in the frequency range, $f5_{CH2}$ of about 804 MHz to 828 MHz, for example, in divide by 4 mode and VCO range of $f5_{VCO}$. The divide by 2 circuit 122 may be enabled to divide the frequency of the received I component of the output signal from the divide by 2 circuit 118 and generate an output signal with half the frequency of the received input signal for 802.11b/g band WLAN operation. For example, the divide by 2 circuit 122 may generate I and Q components of an output signal in the frequency range, $f4_{CH3}$ of about 482 MHz to 497 MHz, for example for 802.11 b/g band WLAN operation in divide by 8 mode and VCO range of $f4_{VCO}$.

The divide by 2 circuit 120 may be a dummy circuit and may be enabled to receive the Q component of the output signal from the divide by 2 circuit 118. The Q component generated by the divide-by-two circuit 118 may be coupled to the dummy load or divide by 2 circuit 120 with negligible power consumption. This results in symmetric loading of the divide-by-two circuit 118 and perfect I-Q matching. The dummy load may comprise a load that is equivalent to the divide by 2 circuit 122.

The divide by 2 circuit 108 may be symmetrically loaded. For example, the I component of the divide by 2 circuit 108 may be coupled to a divide by 2 circuit 112 and the plurality of image rejection mixers 114 and 124. Similarly, the Q component of the divide by 2 circuit 108 may be coupled to a divide by 2 circuit 118 and the plurality of image rejection mixers 114 and 124.

The image rejection mixer 114 may comprise suitable logic, circuitry, and/or code that may be enabled to mix the frequencies of the received signals from the VCO 102 and at least one of the plurality of divide by 2 circuits 108 and 112 to generate an output signal to the buffer 116. The image rejection mixer 114 may be enabled to suppress unwanted images of frequencies by processing the received signal and image differently. The image rejection mixer 114 may be enabled to receive the I and Q components of the output signals generated by the plurality of divide by 2 circuits 108 and 112. The image rejection mixer 114 may be enabled to generate an output signal for the particular wireless band of operation based on mixing a plurality of received signals within a selected frequency range. The buffer 116 may be enabled to generate a buffered output of the received signal from the image rejection mixer 114 to the plurality of RC circuits 130 and 132. The baseband processor 110 may be enabled to select at least one of the plurality of signals received from the plurality of divide by 2 circuits 108 and 112. For example, the image rejection mixer 114 may be enabled to mix the frequency of the received signal from the VCO buffer 106, and one of the frequencies of the I and Q components of the received signal from the divide by 2 circuit 108, and the frequency of the I and Q components of the received signal from the divide by 2 circuit 112 to generate an output signal to the buffer 116.

The image rejection mixer 124 may comprise suitable logic, circuitry, and/or code that may be enabled to mix the frequencies of the received signals from the divide by 2 circuit 108 and at least one of the plurality of divide by 2 circuits 118 and 122 to generate an output signal to the buffer 128. The image rejection mixer 124 may be enabled to suppress unwanted images of frequencies by processing the received signal and image differently. The image rejection mixer 124 may be enabled to receive the I and Q components of the output signals generated by the plurality of divide by 2 circuits 108, 118, and 122. The image rejection mixer 124 may be enabled to generate an output signal for the particular wireless band of operation based on mixing a plurality of received signals within a selected frequency range. The buffer 128 may be enabled to generate a buffered output of the received signal from the image rejection mixer 124 to the plurality of RC circuits 134 and 136. The baseband processor 110 may be enabled to select at least one of the plurality of signals received from the plurality of divide by 2 circuits 118 and 122. For example, the image rejection mixer 124 may be enabled to mix the frequency of the I and Q components of the received signal from the divide by 2 circuit 108, and one of the frequencies of the I and Q components of the received signal from the divide by 2 circuit 118 and the frequency of the I and Q components of the received signal from the divide by 2 circuit 122 to generate an output signal to the buffer 128.

The plurality of RC circuits 130 and 132 may comprise suitable logic, circuitry, and/or code that may be enabled to generate I and Q components of a received signal to the plurality of last stage buffers 138, 139, 140, and 141 by shifting the phase of the received signal from the buffer 116. The plurality of last stage buffers 138, 139, 140, and 141 may be enabled to amplify signals and generate an output to a transmitter/receiver for 802.11 a band WLAN operation. The I and Q components of the output signal generated by the plurality of last stage buffers 138, 139, 140 and 141 may be in the frequency range, $f1_{out}$ of about 4920 MHz to 5000 MHz, for example, for 802.11 a band WLAN operation in divide by 4 mode and VCO range of $f1_{VCO}$. The I and Q components of the output signal generated by the plurality of last stage buffers 138, 139, 140 and 141 may be in the frequency range, $f2_{out}$ of about 5020 MHz to 5900 MHz, for example, for 802.11 a band WLAN operation in divide by 2 mode and VCO range of $f2_{VCO}$. The I and Q components of the output signal generated by the plurality of last stage buffers 138, 139, 140 and 141 may be in the frequency range, $f3_{out}$ of about 4920 MHz to 5900 MHz, for example, for 802.11 a band WLAN operation in divide by 2 mode and VCO range of $f3_{VCO}$.

The plurality of RC circuits 134 and 136 may comprise suitable logic, circuitry, and/or code that may be enabled to generate I and Q components of a received signal to the plurality of last stage buffers 142, 143, 144, and 145 by shifting the phase of the received signal from the buffer 128. The plurality of last stage buffers 142, 143, 144, and 145 may be enabled to amplify signals and generate an output to a transmitter/receiver for 802.11b/g band WLAN operation. The I and Q components of the output signal generated by the plurality of last stage buffers 142, 143, 144 and 145 may be in the frequency range, $f4_{out}$ of about 2412 MHz to 2484 MHz, for example, for 802.11 b/g band WLAN operation in divide by 8 mode and VCO range of $f4_{VCO}$. The I and Q components of the output signal generated by the plurality of last stage buffers 141, 143, 144, and 145 may be in the frequency range, $f5_{out}$ of about 2412 MHz to 2484 MHz, for example, for 802.11 b/g band WLAN operation in divide by 4 mode and VCO range of $f5_{VCO}$.

In a chip handling both WLAN connection and Bluetooth connection, the baseband processor 110 may avoid pulling of the VCO 102 by the second harmonics generated by the VCO 102 by selecting an input frequency range of operation at VCO 102 based on a particular wireless band of operation, for example, 802.11a/b/g wireless band of operation. Similarly, the I and Q components of an output signal generated by the divide by 2 circuit 108 in the frequency range of about 1673.3 MHz to 1966.7 MHz, for example, may not interfere with frequencies of the generated signals of the VCO 202 operating in a Bluetooth mode of operation.

Figure 2:
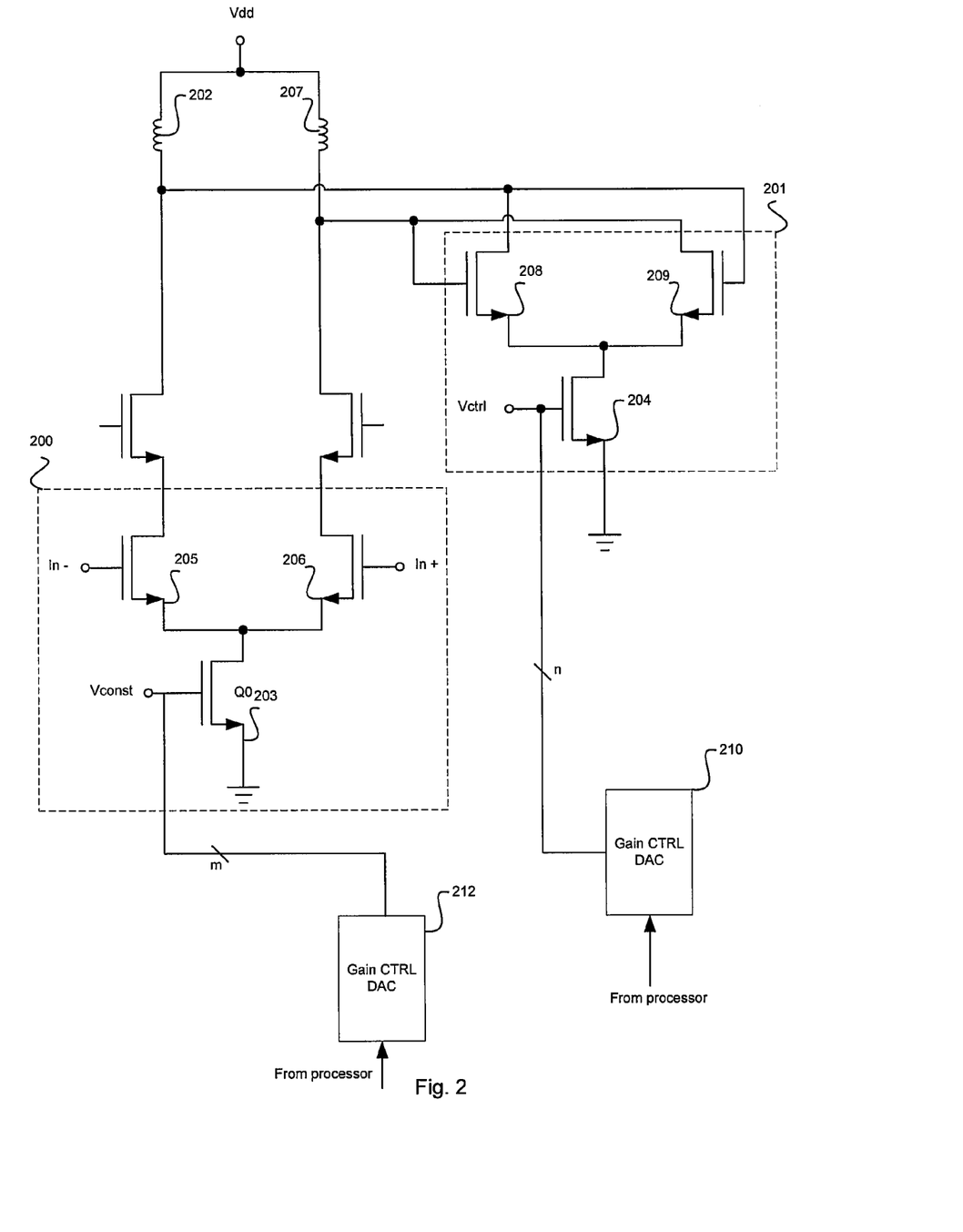
FIG. 2 is a circuit diagram of an exemplary output section of an inductive module, which may be utilized in connection with an embodiment of the invention.

FIG. 2 is a circuit diagram of an exemplary output section of an inductive module, which may be utilized in connection with an embodiment of the invention. Referring to FIG. 2, there is shown an input section 200, a pair of inductors 202 and 207, a gain enhancement section 201, a gain control DAC 210, and a gain control DAC 212. The input section comprises a differential pair of NMOS transistors 205 and 206 and a constant current source 203. The gain enhancement section 201 comprises a differential pair of NMOS transistors 208 and 209, and a variable current source 204.

The circuit shown in FIG. 2 may be representative of the output section of inductive modules, such as a VCO 102 (FIG. 1), a mixer 114 and 124 (FIG. 1), or a LOGEN buffer 116 and 128 (FIG. 1). A differential input signal may be input into the output section of an inductive module via the differential pair of NMOS transistors 205 and 206 in the input section 200. The gain of the input section may be controlled by the constant current source 203. In this regard, the constant current source may comprise an NMOS transistor with a constant voltage applied to the gate, in which case the gate voltage may be set to a voltage sufficient to produce a nominal gain in the input section. The gate may also be coupled to the gain control DAC 212, which may facilitate dynamic gain adjustment.

The output of the input section 200 may be coupled to the gain enhancement section 201 via the differential pair of NMOS transistors 208 and 209 in the input section 200. The gain of the gain enhancement section 201 may be controlled by the variable current source 204. Like the constant current source 203, the variable current source 204 may comprise an NMOS transistor and its gate voltage may determine the amount of current that passes through the NMOS transistor.

The gain control DAC 210 may comprise suitable logic, circuitry, and/or code that may enable the generation of a DC voltage in proportion to a n-bit code word input, for example, a 4-bit code word count. The gain control DAC 210 may be input into the gate of the NMOS transistor 204 of the gain enhancement section 201. The gain control 212 may comprise suitable logic, circuitry, and/or code that may enable the generation of a DC voltage in proportion to a m-bit code word input, for example, a 4-bit code word count. In this regard, the output of the gain control DAC 212 may be input into the gate of the NMOS transistor 203 of the input section 200. Thus, the 4-bit code word input into the gain control DAC 210 and the gain control DAC 212 may be utilized to set the gain of the module. The gain of the module may, for example, be dynamically adjusted to compensate for PVT variations.

Figure 3:
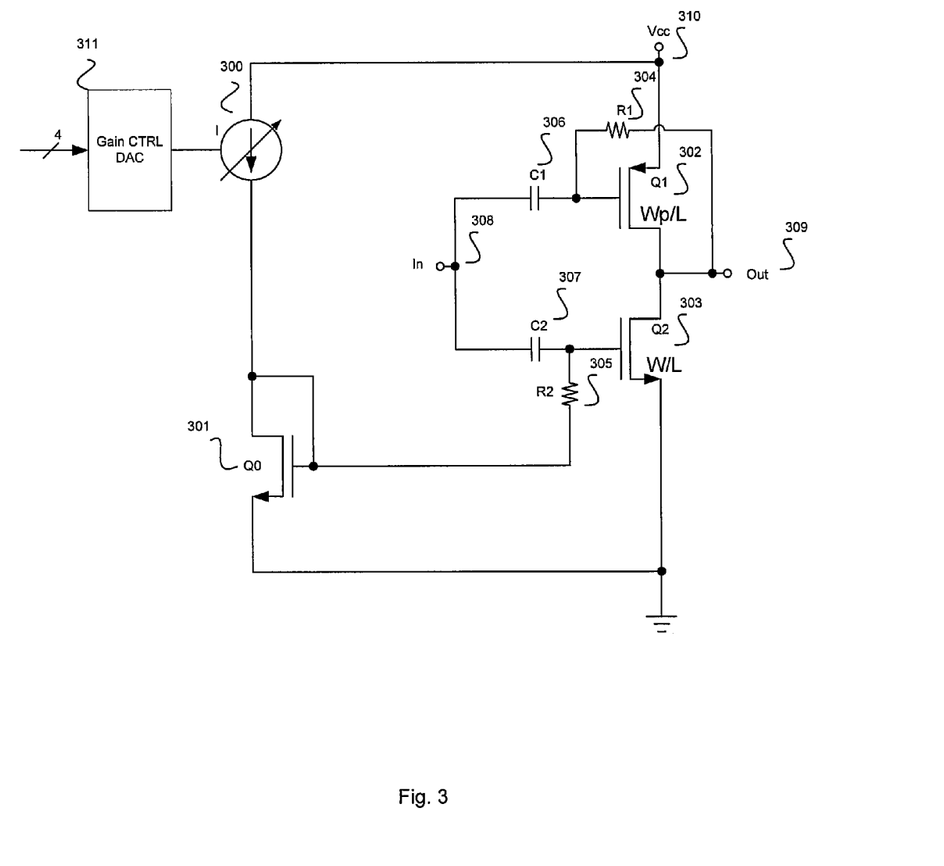
FIG. 3 is a circuit diagram of an exemplary output section of a non-inductive module, which may be utilized in connection with an embodiment of the invention.

FIG. 3 is a circuit diagram of an exemplary output section of a non-inductive module, which may be utilized in connection with an embodiment of the invention. Referring to FIG. 3; there is shown an adjustable current source 300; transistors Q0 301, Q1 302, and Q2 303; resistors R1 304 and R2 305; capacitors C1 306 and C2 307; a clock input node 308; a clock output node 309; a power supply node 310; and a gain control DAC 311.

The adjustable current source 300 may comprise suitable circuitry that may enable the generation of a variable current supply. The output current produced by the adjustable current source 300 may be immune to variations in the voltage at the power supply node 310. Current from the adjustable current source 300 may be coupled to transistor Q0 301.

The transistor Q0 301 may be an NMOS transistor and the gate and source may be coupled. In this configuration, the transistor Q0 301 may take on characteristics of a diode when, for example, the current from the adjustable current source 300 is passed through Q0 301. A voltage drop may develop across the gate and source of Q0 301. For example, the voltage measured at the gate by virtue of the coupling, may equal 0.9 volts for a given current. The voltage measured at the gate of the Q0 301 may increase as the current flow through Q0 301 increases. Stated differently, variations in the amount of current produced by the adjustable current source 300 may produce corresponding variations in voltage across the Q0 301.

The transistor Q1 302 may be a PMOS transistor and Q2 303 may be an NMOS transistor. The gate of Q1 302 may be coupled to a first end of the resistor R1 304 and a first end of capacitor C1 306. The source of the transistor Q1 302 may be coupled to the power supply node 310. The drain of the transistor Q1 302 may be coupled to a second end of resistor R1 304, the output node 309, and the drain of transistor Q2 303. The gate of the transistor Q2 303 may be coupled to a first end of the capacitor C2 307 and a first end of the resistor R2 305. The source of the transistor Q2 303 may be coupled to ground. A second end of the capacitor C1 and the capacitor C2 may be coupled and to the clock input node 308.

The configuration of the transistors Q1 302 and Q2 303 may enable the amplification of a clock signal present at the clock input node 308. In this regard, the amount of amplification may depend on the biasing of the transistors Q1 302 and Q2 303. The DC voltage present on the respective gates may determine the bias point of the transistors. The capacitors C1 306 and C2 307 may block the DC voltages on the respective gates from interfering with one another while at the same time may allow the AC portion of the clock signal to reach the respective gates. The DC voltage present on the gate of the transistor Q2 303 may equal the voltage drop across the transistor Q0 301. R1 304 may enable the gate of the transistor Q1 302 to self bias (Diode characteristic) to a voltage equal to the difference between the voltage at the power supply node 310 and the gate voltage of the transistor Q2 303. Once biasing has been established, the gate to source voltage at the transistors Q1 302 and Q2 303 may be about ½ of the voltage at the power supply node 310.

The gain control DAC 311 may comprise suitable logic, circuitry, and/or code that may enable the generation of a DC voltage in proportion to a 4-bit code word input. In this regard, the 4-bit code word may be utilized to set the gain of the module. The gain of the module may, for example, be dynamically adjusted to compensate for PVT variations.

In operation, a clock signal may be input into the clock input node 308 and amplified by the transistors Q1 302 and Q2 303. The amplified clock signal may then be output from the clock output node 309. The amount of gain produced by the transistors Q1 302 and Q2 303 may be controlled by varying the voltage at the gate of Q2 303. This voltage may be equal to the voltage drop across the transistors Q0 301, which may be controlled by varying the output current from the adjustable current source 300. The output current from the adjustable current source 300 may be controlled via the gain control DAC 311, which may output a specific voltage based upon a 4-bit code. Thus, the 4-bit code may control the gain of the non-inductive module. As stated above, the amount of current output from the adjustable current source 300 may not be susceptible to variations in the voltage at the power supply node 310. Thus, the circuit shown in FIG. 3 may enable the amplification of a clock signal with a constant gain.

Figure 4:
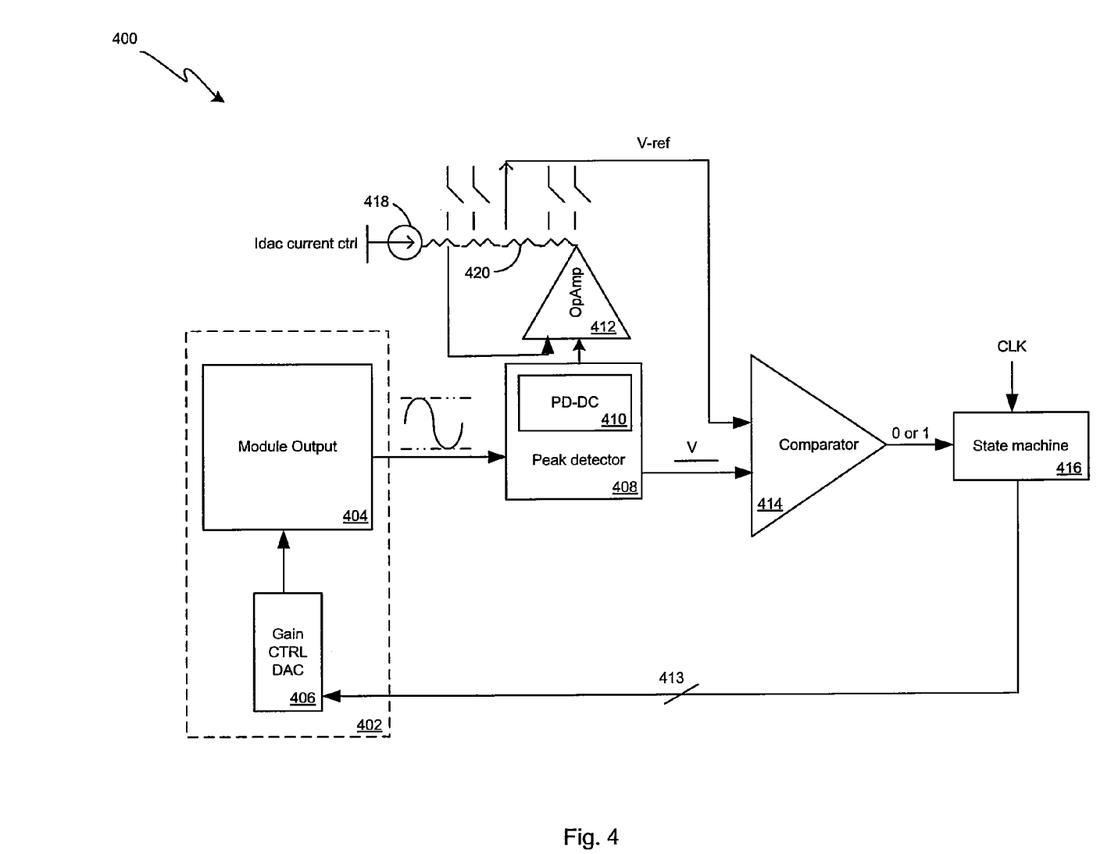
FIG. 4 is a block diagram of an exemplary system for amplitude control of a LOGEN module, in accordance with an embodiment of the invention.

FIG. 4 is a block diagram of an exemplary system for amplitude control of a LOGEN module, in accordance with an embodiment of the invention. Referring to FIG. 4, there is shown an exemplary system 400 that comprises a LOGEN module 402, a peak detector 408, an operational amplifier (op-amp) 412, a current source 418, a variable resistor 420, a comparator 414, and a state machine 416. The LOGEN module 402 may comprise at least one module output section 404, and a gain control DAC 406. The peak detector 408 may comprise a DC peak detector 410.

The LOGEN module 402 may correspond to one of the various modules shown in FIG. 1, such as the VCO 102, the various mixers 114 and 124, the LOGEN buffers 116 and 128, or the I/Q buffers 138-145. The peak detector 408 may comprise suitable logic, circuitry, and/or code that may be enabled to determine the peak amplitude of the output signal of a buffer and to generate a corresponding analog voltage to the comparator 410. The DC peak detector 410 may comprise suitable logic, circuitry, and/or code that may be enabled to determine the DC component of the peak amplitude of the output signal of the module output 404 and to generate an output voltage to the op-amp 412. The peak detector 408 may be enabled to generate a first input signal to the comparator 414 that may be equal to the sum of the DC component of the peak amplitude of the output signal of the module output 404 and the peak amplitude of the output signal of the module output 404.

The op-amp 412 may comprise suitable logic, circuitry, and/or code that may be enabled to receive the DC peak, average or rms voltage of the corresponding output signal of the module output 404 and to generate an output signal. A reference voltage (VREF) may be determined based on the desired voltage level needed at the output of the module output 404. The current source 418 and the variable resistor 420 may be enabled to generate a voltage drop based on the desired output signal for the module output 404. The op-amp 412 may be enabled to receive the voltage drop generated by the current source 418 and the variable resistor 420. The op-amp 412 may be enabled to generate the reference voltage (VREF) according to the following equation:

$$VREF = (I * R) + PD\_DC$$

where PD_DC is the output of the op-amp 412 and may be equal to the DC voltage of the output signal of the module output 404, I is equal to the current generated by the current source 418, and R is equal to the resistance of the variable resistor 420. The reference voltage (VREF) may be input to the comparator 414 as a second input signal.

The comparator 414 may comprise suitable logic, circuitry, and/or code that may be enabled to receive a first input signal equal to the sum of the DC component of the output signal of the module output 404 and the peak amplitude of the output signal of the module output 404. The comparator 414 may be enabled to receive a second input signal equal to the reference voltage (VREF). The comparator 414 may be enabled to compare the received first input signal and the second input signal and generate a digital signal to the state machine 416.

The state machine 416 may comprise suitable logic, circuitry, and/or code that may be enabled to receive a digital signal from the comparator 414 and generate a digital control signal 413 to the gain control DAC 406 to adjust the gain of the module output 404. The state machine 416 may receive timing information from a clock. In an exemplary embodiment of the invention, the state machine 416 may be enabled to communicate the digital control signal 413 to the gain control DAC 406 one bit at a time, for example.

Figure 5:
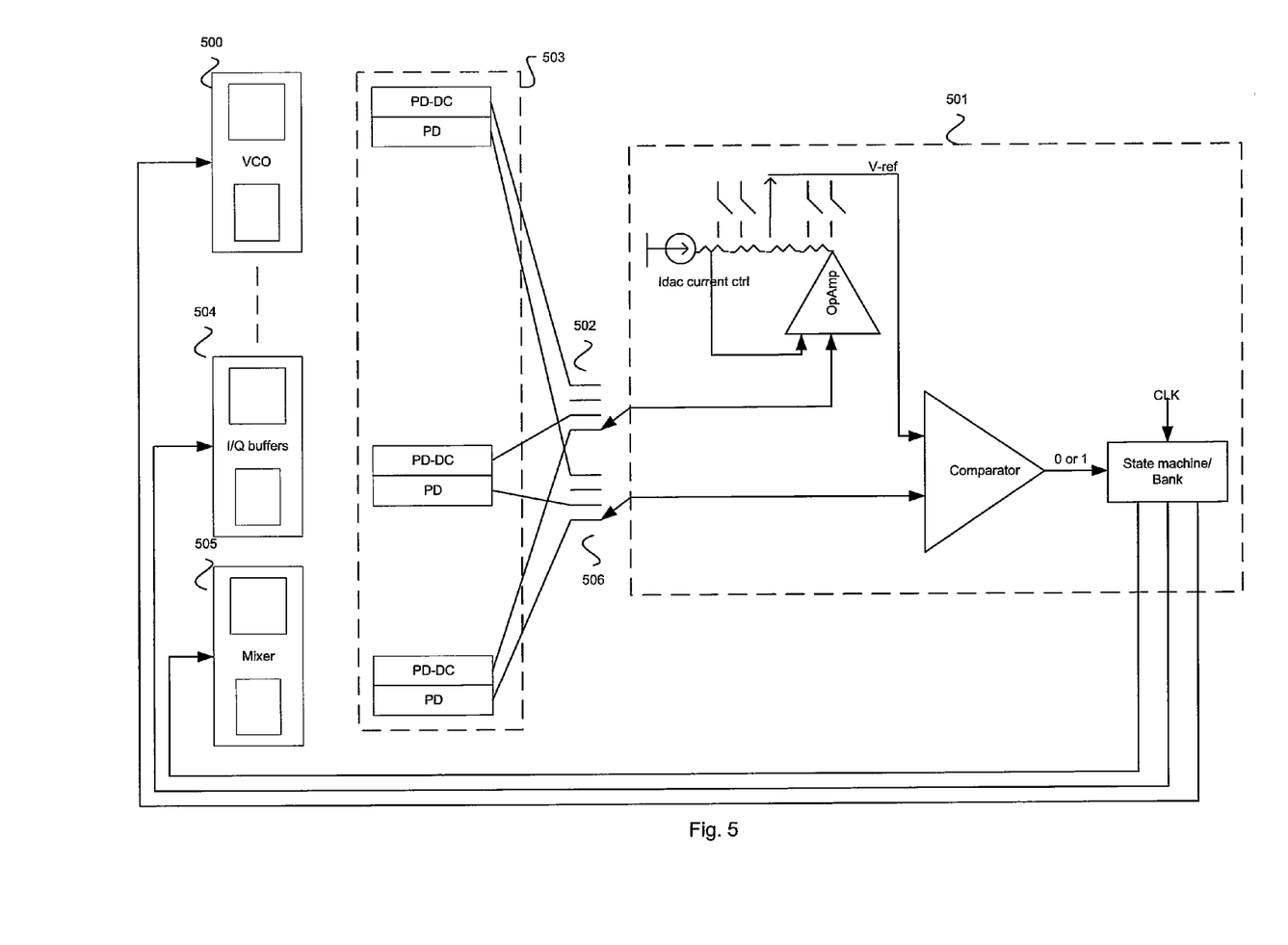
FIG. 5 is a block diagram illustrating an exemplary system for multiplexed amplitude loop control, in accordance with an embodiment of the invention.

FIG. 5 is a block diagram illustrating an exemplary system for multiplexed amplitude loop control, in accordance with an embodiment of the invention. Referring to FIG. 5, there are shown several LOGEN modules 500, 504, and 505, peak detectors 503 corresponding to the modules, a DC mux 502, a peak detect mux 506, and a feedback control section 501. The VCO 500 may comprise suitable logic, circuitry and or code that may enable the generation of an output frequency based on an input voltage. The VCO 500 may correspond to the VCO buffer 106 shown in FIG. 1. The VCO buffer 106 may also comprise a peak detector 408 as shown in FIG. 4. In addition, the output section of the VCO buffer 106 may correspond to the inductive module shown in FIG. 2. In this regard, the gain of the VCO buffer 106 output signal may be adjustable via a 4-bit code word.

The mixer 505 may comprise suitable logic, circuitry, and/or code that may enable outputting the product of two input signals. In this regard, the mixer 505 may be utilized to demodulate an input signal from a carrier frequency down to a baseband frequency. The mixer 505 may correspond to the mixers 114 and 124 shown in FIG. 1. The mixer 505 may also comprise a peak detector 408 as shown in FIG. 4. In addition, the output section of the mixer 505 may correspond to the inductive module shown in FIG. 2. In this regard, the gain of the mixer 505 output signal may be adjustable via a 4-bit code word.

The I/Q buffer 504 may comprise suitable circuitry that may enable amplifying an analog signal. In this regard, the signal input into the I/Q buffer 504 may correspond to I/Q signals. The I/Q buffer 504 may correspond to the several I/Q buffers 138-145 shown in FIG. 1. The I/Q buffer 504 may also comprise a peak detector 408 as shown in FIG. 4. In addition, the output section of the I/Q buffer 504 may correspond to the non-inductive module shown in FIG. 3. In this regard, the gain of the I/Q buffer 504 output signal may be adjustable via a 4-bit code word. It should be understood that the number of modules shown in FIG. 5 is only exemplary and the actual number of modules may be more or less depending on the complexity of the LOGEN, for example.

The peak detectors 503 may comprise suitable circuitry and/or code that may enable the detection of the peek voltage of an analog signal as well as the DC value of the analog signal. The peak detectors 503 may correspond to the peak detector 408 shown in FIG. 4. The peak detectors 503 may reside within the respective modules. For example, the VCO 500, mixer 505 and I/Q buffer 504 may comprise a peak detector 408.

The two muxes 502 and 506 may comprise suitable circuitry and/or logic that may enable routing one of several input signals to a single output signal. In this regard, the DC output of the peak detectors 503 within the various modules 500, 504, and 505 may be input into the input pins of the DC mux 502. The DC mux 502 may then be utilized to route a selected peak detector DC output to the output pin of the DC mux 502. This signal may then be input into an OpAmp residing within the feedback control section 501. In a similar manner, the peak detect mux 506 may be utilized to route the peak amplitude detected from the selected module to a comparator within the feedback control section 501

The feedback control section 501 may comprise suitable logic, circuitry, and/or code that may enable controlling the amplitude of a LOGEN module. In this regard, the feedback control section 501 may comprise the OpAmp 412, comparator 414, current source 418, variable resistor 420, and state machine 416 shown in FIG. 4. The feedback control section may be configured to control a plurality of modules. In this regard, an Idac control current specific to a currently selected module may be input into a variable resistor 420 from the current source 418. A tap on the variable resistor 420 specific to the currently selected module may be selected as well. The combination of the Idac control current and selected variable resistor 420 plus the DC component of the peak detector as described above may facilitate the removal of the DC component of the envelope from the selected module, thus facilitating the detection of the peak signal voltage. The feedback control section 501 may then output a 4-bit code word via the state machine 416 to the selected module. In this regard, the state machine 416 may comprise a bank of memory to store the 4-bit code words for all the modules to be calibrated. The 4-bit code word may be utilized to raise or lower the gain of the selected module. The feedback control section 501 may raise or lower the gain until the amplitude of the output of the selected module reaches a specified value.

In operation, the muxes 502 and 506 may route the various peak detector output signals to the feedback control section 501. The feedback control section 501 may then calibrate the output signal of the selected module via a 4-bit code word, which may be utilized to adjust the gain of the output section of the selected module. After calibration has completed, the muxes 502 and 506 may then select a second module and that module may be calibrated the same way. This process may, for example, repeat until all the desirable modules may have been calibrated. The muxes 502 and 506 may facilitate the efficient reuse of the circuitry within the feedback control section 501. Although only three modules are shown, it is to be understood that additional modules may be calibrated by increasing the number of inputs on the muxes 502 and 506.

Figure 6:
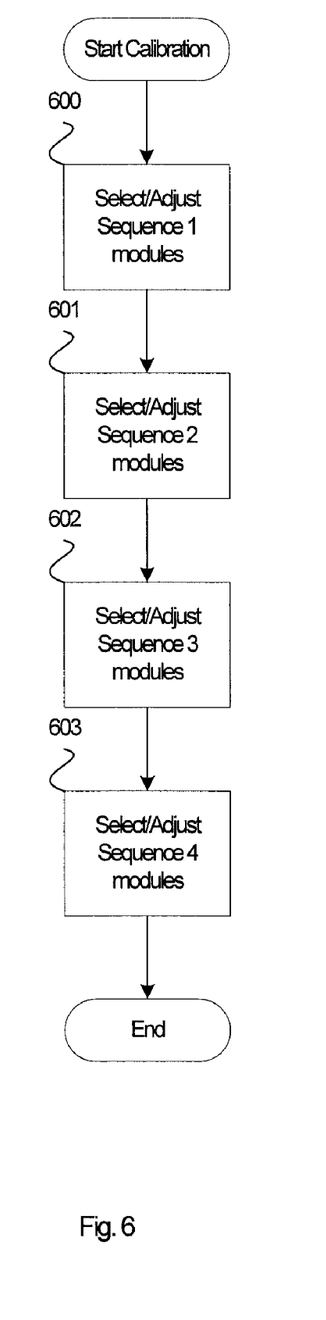
FIG. 6 is a block diagram of an exemplary flow diagram for calibrating a plurality of modules, in accordance with an embodiment of the invention.

FIG. 6 is a block diagram of an exemplary flow diagram for calibrating a plurality of modules, in accordance with an embodiment of the invention. At step 600, modules at the front of the LOGEN architecture may be selected and calibrated. For example, the peak detector within the VCO buffer 106 (FIG. 1) may be selected via the DC mux 502 and the peak detect mux 506. The output of the muxes 502 and 506 may then be routed to the OpAmp and comparator respectively within the feedback control section 501.

At the same time, an Idac control current specific to a currently selected module may be input into a variable resistor 420 (FIG. 4) from the current source 418 (FIG. 4). A tap on the variable resistor 420 specific to the currently selected module may be selected as well. The combination of the Idac control current and selected variable resistor 420 plus the DC component of the peak detector as described above may facilitate the removal of the DC component of the envelope from the selected module, thus facilitating the detection of the peak signal voltage.

The comparator may then output either a 0 or 1, depending on the peak signal detected as described above in FIG. 4. The state machine may then output a 4-bit control signal that may be input into the gain control DAC 210 (FIG. 2) 305 (FIG. 3) of the selected module, thus closing the amplitude control loop. The feedback control section 501 may then determine whether the amplitude of the output signal from the selected module is, for example, close to a value or within a specified range. If the amplitude is not close or within the specified range, the feedback control section 501 may output a 4-bit control word that may increase or decrease the gain of the selected module. This process may repeat until the output amplitude of the selected module falls close to a set value or within a specified range.

At step 601, the mixers 114 and 124 may be calibrated in a similar manner, followed by the LOGEN buffers 116 and 128 at step 602. At step 603, the I/Q buffers 138-145 may be calibrated. Proper calibration of the modules may be dependent on the sequence chosen. For example, if the I/Q buffers 138-145 are calibrated first, the gain in the buffers may have to be set unnecessarily high if the output of the previous module is too low. Then when the previous module is calibrated, and its output increased, the output of the I/Q buffers 138-145 may be too high. Following a particular calibration sequence may facilitate the efficient calibration of all the modules within the LOGEN. It should be understood that the number of steps involved in the calibrating process was meant by way of example only. The number of steps required may be more or less depending, for example, on the number stages that make up the entire system.

Another embodiment of the invention may provide a method for performing the steps as described herein for calibrating a plurality of modules in a communication system. For example, a module with an analog output signal may be selected via a DC mux 502 and a peak-detect mux 506. A feedback control circuit 501 may be utilized to calibrate the amplitude of the module so that it falls within a specified range or close to a desired value for that module via a gain control processing circuit 210 (FIG. 2) and 305 (FIG. 3). The modules may be calibrated in an order starting with a first module located at an input of a signal path and ending with a module located at an output of the signal path. The DC component and amplitude of the envelope of the output signal of the module may be detected by circuitry within the selected module. Muxes may be utilized to route the DC component and amplitude of the envelope to the feedback control circuit 501.

Accordingly, the present invention may be realized in hardware, software, or a combination of hardware and software. The present invention may be realized in a centralized fashion in at least one computer system or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for processing signals in a communication system, the method comprising:
   selecting at least one of a plurality of modules that enable generation of at least one output signal along a signal path; and
   calibrating an amplitude of said selected at least one of said plurality of modules to be, during said generation of said at least one output signal, within a specified frequency range if said amplitude is out of said specified frequency range, via a gain control processing circuit of said selected at least one of said plurality of modules, wherein said plurality of modules is calibrated in an order starting with a first module located at an input of said signal path and ending with a module located at an output of said signal path.

2. The method according to claim 1, comprising detecting a DC component of an envelope of said at least one output signal.

3. The method according to claim 1, comprising detecting an amplitude of an envelope of said at least one output signal.

4. The method according to claim 1, comprising detecting one or both of: a DC component and/or an amplitude of an envelope of said at least one output signal within said selected at least one of said plurality of modules.

5. The method according to claim 4, comprising routing said one or both of: said DC component and/or said amplitude of said envelope of said at least one output signal via at least one multiplexer to a feedback control processing circuit.

6. The method according to claim 5, comprising communicating an n-bit code word from said feedback control processing circuit to said gain control processing circuit of said selected at least one of said plurality of modules, wherein n is an integer greater than or equal one.

7. The method according to claim 1, wherein said selected at least one of said plurality of modules comprises one or more of: a mixer, a VCO, and/or a buffer.

8. The method according to claim 1, wherein said signal path comprises one or both of: an in-phase processing path and/or a quadrature processing path.

9. A non-transitory machine-readable storage medium having stored thereon, a computer program having at least one code section for processing signals in a communication system, the at least one code section being executable by a machine for causing the machine to perform steps comprising:
- selecting at least one of a plurality of modules that enable generation of at least one output signal along a signal path; and
- calibrating an amplitude of said selected at least one of said plurality of modules to be, during said generation of said at least one output signal, within a specified frequency range if said amplitude is out of said specified frequency range, via a gain control processing circuit of said selected at least one of said plurality of modules, wherein said plurality of modules is calibrated in an order starting with a first module located at an input of said signal path and ending with a module located at an output of said signal path.

10. The machine-readable storage medium according to claim 9, wherein said at least one code section comprises code that enables detecting a DC component of an envelope of said at least one output signal.

11. The machine-readable storage medium according to claim 9, wherein said at least one code section comprises code that enables detecting an amplitude of an envelope of said at least one output signal.

12. The machine-readable storage medium according to claim 9, wherein said at least one code section comprises code that enables detecting one or both of: a DC component and/or an amplitude of an envelope of said at least one output signal within said selected at least one of said plurality of modules.

13. The machine-readable storage medium according to claim 12, wherein said at least one code section comprises code that enables routing said one or both of: said DC component and/or said amplitude of said envelope of said at least one output signal via at least one multiplexer to a feedback control processing circuit.

14. The machine-readable storage medium according to claim 13, wherein said at least one code section comprises code that enables communicating an n-bit code word from said feedback control processing circuit to said gain control processing circuit of said selected at least one of said plurality of modules, wherein n is an integer greater than or equal one.

15. The machine-readable storage medium according to claim 9, wherein said selected at least one of said plurality of modules comprises one or more of: a mixer, a VCO, and/or a buffer.

16. The machine-readable storage medium according to claim 9, wherein said signal path comprises one or both of: an in-phase processing path and/or a quadrature processing path.

17. A system for processing signals in a communication system, the system comprising:
- a plurality of circuits that enables selecting at least one of a plurality of modules that enable generation of at least one output signal along a signal path; and
- said plurality of circuits enables calibrating an amplitude of said selected at least one of said plurality of modules to be, during said generation of said at least one output signal, within a specified frequency range if said amplitude is out of said specified frequency range, said plurality of circuits comprising a gain control processing circuit of said selected at least one of said plurality of modules, wherein said plurality of modules is calibrated in an order starting with a first module located at an input of said signal path and ending with a module located at an output of said signal path.

18. The system according to claim 17, wherein said plurality of circuits enables detecting a DC component of an envelope of said at least one output signal.

19. The system according to claim 17, wherein said plurality of circuits enables detecting an amplitude of an envelope of said at least one output signal.

20. The system according to claim 17, wherein said plurality of circuits enables detecting one or both of: a DC component and/or an amplitude of an envelope of said at least one output signal within said selected at least one of said plurality of modules.

21. The system according to claim 20, wherein said plurality of circuits enables routing said one or both of: said DC component and/or said amplitude of said envelope of said at least one output signal via at least one multiplexer to a feedback control processing circuit.

22. The system according to claim 21, said plurality of circuits enables communicating an n-bit code word from said feedback control processing circuit to said gain control processing circuit of said selected at least one of said plurality of modules of said selected plurality of modules, wherein n is an integer greater than or equal one.

23. The system according to claim 17, wherein said selected at least one of said plurality of modules comprises one or more of: a mixer, a VCO, and/or a buffer.

24. The system according to claim 17, wherein said signal path comprises one or both of: an in-phase processing path and/or a quadrature processing path.

25. A method for processing signals in a communication system, the method comprising:
- selecting one or more modules of a plurality of modules that enable generation of at least one output signal along a signal path; and
- calibrating an amplitude of said selected one or more modules of said plurality of modules to be, during said generation of said at least one output signal, within a specified frequency range if said amplitude is out of said specified frequency range, via a gain control processing circuit of said selected one or more modules, wherein said selected one or more modules is calibrated in an order starting with a first module located at an input of said signal path and ending with a module located at an output of said signal path when more than one module is selected.

26. The method according to claim 25, comprising detecting one or both of: a DC component and/or an amplitude of an envelope of said at least one output signal within said selected one or more modules.

27. A non-transitory computer-readable storage medium having stored thereon, a computer program having at least one code section for processing signals in a communication system, the at least one code section being executable by a computer for causing the computer to perform steps comprising:
- selecting one or more modules of a plurality of modules that enable generation of at least one output signal along a signal path; and
- calibrating an amplitude of said selected one or more modules of said plurality of modules to be, during said generation of said at least one output signal, within a specified frequency range if said amplitude is out of said specified frequency range, via a gain control processing circuit of said selected one or more modules, wherein said selected one or more modules is calibrated in an order starting with a first module located at an input of said signal path and ending with a module located at an output of said signal path when more than one module is selected.

28. The computer-readable storage medium according to claim 27, wherein said at least one code section comprises code that enables detecting one or both of: a DC component and/or an amplitude of an envelope of said at least one output signal within said selected one or more modules.

29. A system for processing signals in a communication system, the system comprising:
a plurality of circuits that enables selecting one or more modules of a plurality of modules that enable generation of at least one output signal along a signal path; and
said plurality of circuits enables calibrating an amplitude of said selected one or more modules of said plurality of modules to be, during said generation of said at least one output signal, within a specified frequency range if said amplitude is out of said specified frequency range, via a gain control processing circuit of said selected one or more modules, wherein said selected one or more modules is calibrated in an order starting with a first module located at an input of said signal path and ending with a module located at an output of said signal path when more than one module is selected.

30. The system according to claim 29, wherein said plurality of circuits enables detecting one or both of: a DC component and/or an amplitude of an envelope of said at least one output signal within said selected one or more modules.

\* \* \* \* \*